United States Patent
Rosen (10) Patent No.: US 9,760,103 B2
(45) Date of Patent: Sep. 12, 2017

(54) INTEGRATED CIRCUIT HAVING REGULATOR CONTROLLED BASED ON OPERATIONAL SPEED

(71) Applicant: Marvell Israel (M.I.S.L.) Ltd., Yokneam (IL)

(72) Inventor: Eitan Rosen, Abirim (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 15/157,049

(22) Filed: May 17, 2016

(65) Prior Publication Data
US 2016/0342165 A1 Nov. 24, 2016

Related U.S. Application Data

(60) Provisional application No. 62/163,002, filed on May 18, 2015.

(51) Int. Cl.
| | |
|---|---|
| *H03B 19/00* | (2006.01) |
| *G05F 1/46* | (2006.01) |
| *H03K 21/38* | (2006.01) |
| *G05F 1/59* | (2006.01) |

(52) U.S. Cl.
CPC ............... *G05F 1/468* (2013.01); *G05F 1/59* (2013.01); *H03K 21/38* (2013.01)

(58) Field of Classification Search
CPC ........ G06F 1/08; H03K 5/00006; H03K 7/00; H03K 7/06; H03K 7/08; H03K 7/10
USPC ......... 327/113, 114, 306–333, 538, 540, 541
See application file for complete search history.

(56) References Cited

U.S. PATENT DOCUMENTS

| | | | |
|---|---|---|---|
| 8,354,857 B1 * | 1/2013 | Rosen | G01R 31/3016 324/76.11 |
| 8,370,654 B1 | 2/2013 | Hasko et al. | |
| 2013/0293276 A1 | 11/2013 | Moshe et al. | |
| 2015/0180482 A1 | 6/2015 | Bourstein et al. | |

* cited by examiner

*Primary Examiner* — Lincoln Donovan
*Assistant Examiner* — Diana J Cheng (57) ABSTRACT

Aspects of the disclosure include an integrated circuit that includes a first circuit, a first performance detector, and a first regulator. The first circuit is configured to receive a first regulated voltage from a first voltage supply line disposed on the integrated circuit. The first performance detector includes a first speed monitor disposed adjacent to the first circuit, and the first performance detector is configured to generate a first control signal based on a first speed detection result from the first speed monitor. The first speed detection result corresponds to measuring an operational speed of the first circuit. The first regulator is configured to receive a global supply voltage from a power rail and output the first regulated voltage based on the global supply voltage and the first control signal.

20 Claims, 5 Drawing Sheets

INTEGRATED CIRCUIT HAVING REGULATOR CONTROLLED BASED ON OPERATIONAL SPEED

INCORPORATION BY REFERENCE

This present disclosure claims the benefit of U.S. Provisional Application No. 62/163,002, "UDD as LDO Controller" filed on May 18, 2015, which is incorporated herein by reference in its entirety.

This present disclosure is related to U.S. Pat. No. 8,370,654, "AVS-adaptive voltage scaling," U.S. patent application Ser. No. 13/874,924, "AVS MASTER SLAVE," filed on May 1, 2013 (now published as U.S. Patent Application Publication No. 2013/0293276), and U.S. patent application Ser. No. 14/580,816, "APPARATUS AND METHOD FOR REACTING TO A CHANGE IN SUPPLY VOLTAGE," filed on Dec. 23, 2014 (now published as U.S. Patent Application Publication No. 2015/0180482), which are also incorporated herein by reference in their entireties.

FIELD

This disclosure relates generally to an integrated circuit having a regulator. More specifically, the disclosure relates to controlling the regulator based on a measured operational speed of the integrated circuit.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In many applications, an integrated circuit (IC) chip includes a regulator disposed thereon. The regulator receives a supply voltage from a power source outside the IC chip and outputs a regulated voltage to be used by electrical components on the IC chip. In many applications, the regulator adjusts a voltage level of the regulated voltage based on comparing the voltage level of a feedback voltage that represents the voltage level of the regulated voltage against the voltage level of a reference voltage.

SUMMARY

Aspects of the disclosure include an integrated circuit that includes a first circuit, a first performance detector, and a first regulator. The first circuit is configured to receive a first regulated voltage from a first voltage supply line disposed on the integrated circuit. The first performance detector includes a first speed monitor disposed adjacent to the first circuit, and the first performance detector is configured to generate a first control signal based on a first speed detection result from the first speed monitor. The first speed detection result corresponds to measuring an operational speed of the first circuit. The first regulator is configured to receive a global supply voltage from a power rail and output the first regulated voltage based on the global supplied voltage and the first control signal.

In an embodiment, the first regulated voltage is adjusted by the first regulator without based on performance of other circuits, and the first regulated voltage is supplied only to the first circuit.

In an embodiment, the integrated circuit further includes a second circuit, a second performance detector, and a second regulator. The second circuit is configured to receive a second regulated voltage from a second voltage supply line disposed on the integrated circuit. The second performance detector includes a second speed monitor disposed adjacent to the second circuit, and the second performance detector is configured to generate a second control signal based on a second speed detection result from the second speed monitor. The second speed detection result corresponds to measuring an operational speed of the second circuit. The second regulator is configured to receive the global supply voltage from the power rail and output the second regulated voltage based on the global supply voltage and the second control signal.

In an embodiment, the first performance detector includes a plurality of speed monitors respectively disposed at different locations, and the speed monitors are configured to generate speed detection results indicating whether measured operation speeds are greater than a benchmark, respectively. The first performance detector further includes a detection controller configured to generate the first control signal based on the speed detection results from the plurality of speed monitors.

In an embodiment, the first regulator includes a transistor and a control voltage driver. The transistor includes a first terminal configured to receive the supply voltage, a second terminal electrically coupled with the first voltage supply line and configured to output the first regulated voltage, and a control terminal configured to receive a control voltage. The control voltage driver is configured to output the control voltage based on the first control signal.

In an embodiment, the control voltage driver includes a driving stage and a low-pass filter. The driving stage has an input node and an output node, and the input node of the driving stage being configured to receive the first control signal. The low-pass filter is electrically coupled between the output node of the driving stage and the control terminal of the transistor.

Aspects of the disclosure provide a method of adjusting one or more regulated voltages supplied to one or more respective circuits in an integrated circuit. The method includes determining a first speed detection result by a first speed monitor disposed adjacent to a first circuit in the integrated circuit; determining a first control signal based on the first speed detection result from the first speed monitor; receiving, by a first regulator, a global supply voltage from a power rail; and adjusting, by the first regulator based on the global supply voltage and the first control signal, a first regulated voltage supplied to the first circuit. The first speed detection result corresponds to measuring an operational speed of the first circuit.

In an embodiment, the method further includes determining a second speed detection result by a second speed monitor disposed adjacent to a second circuit in the integrated circuit; determining a second control signal based on the second speed detection result from the second speed monitor; receiving, by a second regulator, the global supply voltage from the power rail; and adjusting, by the second regulator based on the global supply voltage and the second control signal, a voltage level of a second regulated voltage supplied to the second circuit. The second speed detection result corresponds to measuring an operational speed of the second circuit.

In an embodiment, adjusting the voltage level of the first regulated voltage includes determining a control voltage based on the first control signal; and controlling a conductive characteristic of a transistor based on the control voltage. The transistor includes a first terminal configured to receive a supply voltage, a second terminal configured to output the first regulated voltage, and a control terminal configured to receive the control voltage.

Aspects of the disclosure provide an integrated circuit that includes a plurality of circuits configured to receive a plurality of corresponding regulated voltages, a plurality of performance detectors, and a plurality of regulators disposed on the integrated circuit. The plurality of performance detectors includes respective sets of speed monitors disposed adjacent to the respective circuits, and the performance detectors are configured to generate the respective control signal based on speed detection results from the sets of speed monitors. The speed detection results correspond to measuring operational speeds of the respective circuits. The plurality of regulators is configured to receive a supply voltage from a power rail and output the respective regulated voltages based on the supply voltage and the respective control signals.

In an embodiment, each of the plurality of regulators includes a transistor and a control voltage driver. The transistor includes a first terminal configured to receive the supply voltage, a second terminal configured to output the respective regulated voltage, and a control terminal configured to receive a control voltage. The control voltage driver is configured to output the control voltage based on the respective control signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

According to one or more embodiments of the present disclosure, a regulator in an integrated circuit (IC) may be controlled based on a control signal indicating a performance variation of a functional circuit block the regulator serves instead of a voltage variation. In some examples, a circuit for detecting the performance variation can be simpler or more reliable than a circuit for detecting the voltage variation. In some examples, controlling the regulator based on the performance variation can better assure the quality of the IC regardless the variations caused by the manufacturing process, temperature, or the like.

Figure 1:
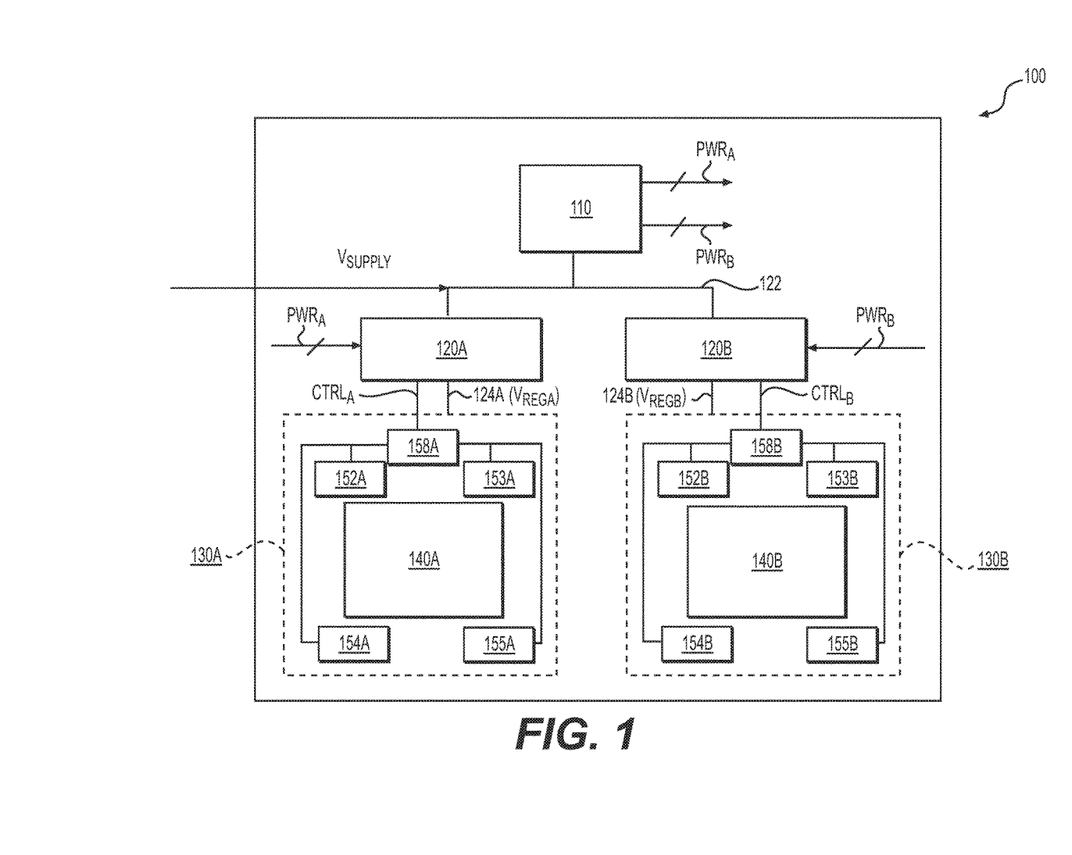
FIG. 1 shows an example functional block diagram of an integrated circuit (IC) chip according to an embodiment of the disclosure.

FIG. 1 shows an example functional block diagram of an integrated circuit (IC) chip 100 according to an embodiment of the disclosure. The IC chip 100 includes a power management controller 110, a first regulator 120A that receives a supply voltage $V_{SUPPLY}$ on a power rail 122 and outputs a first regulated voltage $V_{REGA}$ on a voltage supply line 124A to power electrical components in a first power domain 130A, a second regulator 120B that receives the supply voltage $V_{SUPPLY}$ on the power rail 122 and outputs a second regulated voltage $V_{REGB}$ on a voltage supply line 124B to power electrical components in a second power domain 130B. In some examples, the supply voltage $V_{SUPPLY}$ is a global supply voltage that powers multiple power domains 130A and 130B through corresponding regulators 120A and 120B. The IC chip 100 also includes a first functional circuit block 140A and a first performance detector 150A (not labeled) in the first power domain 130A, and a second functional circuit block 140B and a second performance detector 150B (not labeled) in the second power domain 130B. First performance detector 150A includes a set of speed monitors 152A-155A and a detection controller 158A. Second performance detector 150B includes a set of speed monitors 152B-155B and a detection controller 158B.

In some examples, the power management controller 110 is configured to control the regulators 120A and 120B via control signals $PWR_A$ and $PWR_B$. In some examples, the power management controller 110 determines to deactivate and/or deactivates the regulator 120A. Upon deactivation, the voltage supply line 124A becomes electrically decoupled from the power rail 122. In some examples, the power management controller 110 is configured to control the regulator 120A to electrically short the power rail 122 and the voltage supply line 124A. In some examples, the power management controller 110 determines to deactivate and/or deactivates the regulator 120B. Upon deactivation, the voltage supply line 124B becomes electrically decoupled from the power rail 122. In some examples, the power management controller 110 is configured to control the regulator 120B to electrically short the power rail 122 and the voltage supply line 124B.

The first regulator 120A adjusts the first regulated voltage $V_{REGA}$ on the voltage supply line 124A based on a first control signal $CTRL_A$. In some examples, the first control signal $CTRL_A$ is a digital signal for instructing the first regulator 120A to increase or decrease the voltage level of the first regulated voltage $V_{REGA}$. The first performance detector 150A generates the first control signal $CTRL_A$ based on one or more speed detection results from one or more of the set of speed monitors 152A-155A. The one or more speed detection results corresponding to measuring an operational speed of the first functional circuit block 140A. In some examples, detection controller 158A generates the first control signal $CTRL_A$ based on the one or more speed detection results from the set of speed monitors 152A-155A. In some examples, the first performance detector 150A includes only one speed monitor 152A, and the speed monitors 153A-155A are omitted. In such configuration, the speed monitor 152A outputs the speed detection result as the first control signal $CTRL_A$, and the detection controller 158A may be omitted as well.

The first functional circuit block 140A receives the first regulated voltage $V_{REGA}$ from the voltage supply line 122A. The speed monitors 152A-155A are respectively disposed at different locations adjacent to the first functional circuit block 140A. In one example, the first functional circuit block 140A includes electrical components that define a critical signal path of the first functional circuit block 140A, and at least one of the speed monitors 152A-155A is disposed adjacent to the a critical signal path. In some examples, the first functional circuit block 140A occupies an area in the IC chip, and the speed monitors 152A-155A are disposed at various locations within the same area in the IC chip.

The second regulator 120B, second power domain 130B, second functional circuit block 140B, second performance detector 150B, and associated voltages and signals correspond to the first regulator 120A, first power domain 130A, first functional circuit block 140A, first performance detector 150A, and associated voltages and signals. Therefore, detailed description of the second regulator 120B, second power domain 130B, second functional circuit block 140B, second performance detector 150B, and the associated voltages and signals are omitted.

In some examples, the operational speed of a monitored circuit is measurable based on a delay of a tested circuit, either being a portion of the monitored circuit or a dedicated sample circuit representing the electrical characteristics of the monitored circuit. In some examples, the tested circuit includes a propagation signal path that a digital signal transition at an input end of the propagation signal path would be delayed for a delay value at an output end of the propagation signal path. In some examples, a greater delay value corresponds to a slower operational speed of the tested circuit, and vice versa. In some examples, the speed monitors 152A-155A and 152B-155B generate the corresponding detection results based on the delay characteristics of the corresponding tested circuits.

In some examples, the power domains 130A and 130B have different power requirements and the functional circuit blocks 140A and 140B have different performance requirements. Accordingly, the regulators 120A and 120B and their corresponding control mechanism may be individually tailored.

Two regulators 120A and 120B and two corresponding power domains 130A and 130B are shown in FIG. 1 as a non-limiting example. The IC chip 100 may include more or less than two regulators and corresponding power domains. Four speed monitors 152A-155A or 152B-155B for each performance detector 150A or 150B are shown in FIG. 1 as a non-limiting example. A performance detector in the IC chip 100 may include more or less than four speed monitors. Also, the supply voltage $V_{SUPPLY}$ as shown in FIG. 1 is provided by an external power source. In some examples, the supply voltage $V_{SUPPLY}$ may be provided by a power management circuit on the IC chip 100, which is powered by an external power source or a power generating circuit on the on the IC chip 100.

Figure 2:
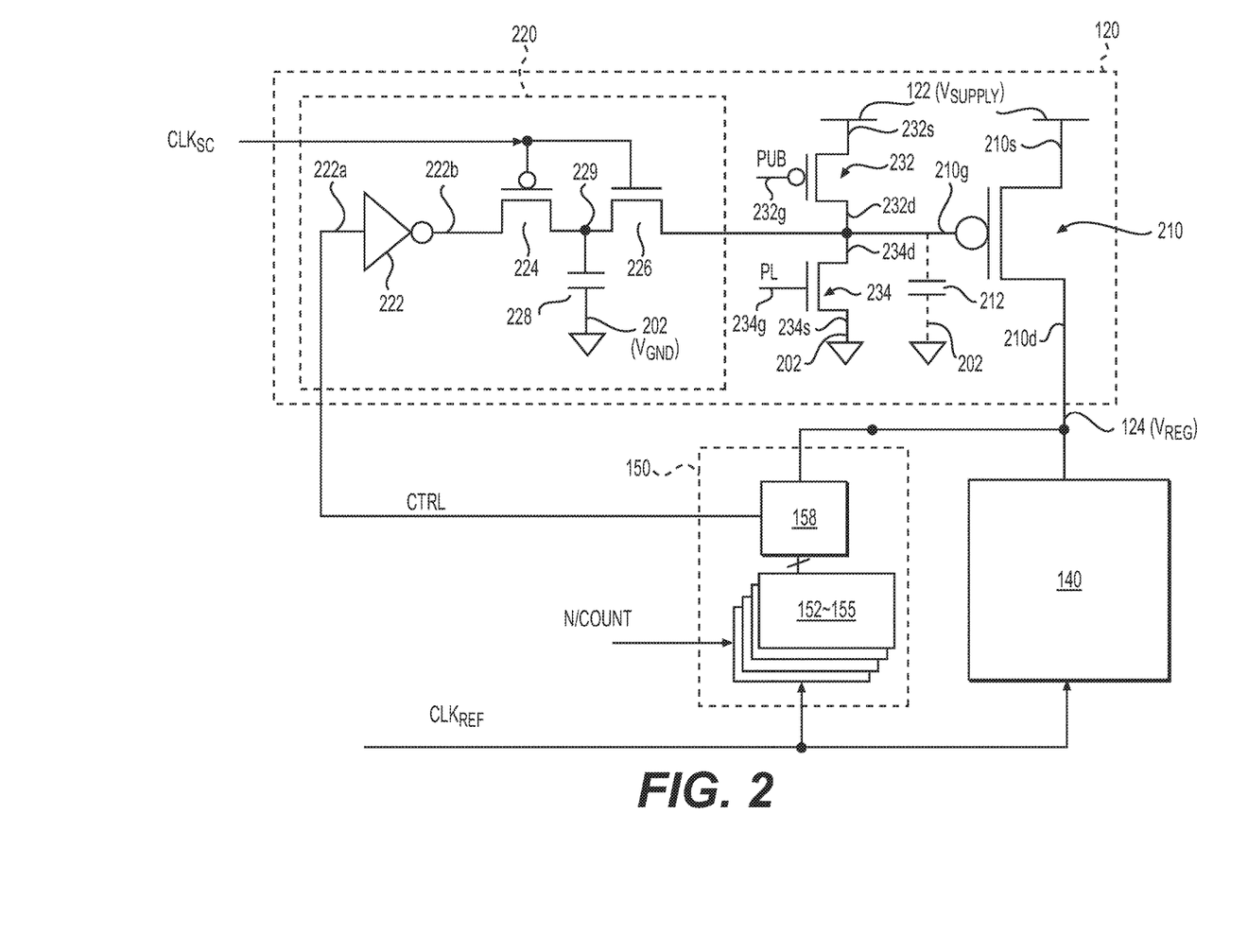
FIG. 2 shows an example schematic diagram of a functional circuit block, a performance detector, and a regulator in an IC chip according to an embodiment of the disclosure.

FIG. 2 shows an example schematic diagram of a portion of an IC chip including a functional circuit block 140, a performance detector 150, and a regulator 120 according to an embodiment of the disclosure. In some examples, the functional circuit block 140 corresponds to the functional circuit block 140A or 140B in FIG. 1; the performance detector 150 corresponds to the performance detector 150A or 150B; and the regulator 120 corresponds to the regulator 120A or 120B. The performance detector 150 includes speed monitors 152-155 and a detection controller 158, where the speed monitors 152-155 correspond to the speed monitors 152A-155A or 152B-155B; and the detection controller 158 corresponds to the detection controller 158A or 158B. Other components in FIG. 2 that are the same or similar to the components in FIG. 1 are given the same reference labels, and detailed description thereof is thus omitted.

The functional circuit block 140 receives a regulated voltage $V_{REG}$ from a voltage supply line 124 disposed on the IC chip. The functional circuit block 140 also receives a reference clock signal $CLK_{REF}$. In some examples, the functional circuit block 140 uses the reference clock signal $CLK_{REF}$ as a system clock signal thereof or generates the system clock signal based on the reference clock signal $CLK_{REF}$. In some examples, the functional circuit block 140 includes one or more or a logic circuit, an analog circuit, a radio frequency circuit, or other suitable type of circuit.

The performance detector 150 includes the speed monitors 152-155 that are disposed at various locations adjacent to the functional circuit block 140. Each one of the speed monitors 152-155 is capable of generating a speed detection result corresponding to measuring an operational speed of the function circuit block 140. The performance of the components of the functional circuit block 140 varies with factors such as process variations, thermal distributions, power/ground distributions, component degradations, or the like. In some examples, the speed monitors 152-155 are disposed at different locations among the electrical components of the functional circuit block 140. Accordingly, in some examples, each one of the speed monitors 152-155 functions as a testing sample circuit representing the respective local performance of the functional circuit block 140. In some examples, the detection result generated by a speed monitor includes a digital signal indicating whether a local operational speed of the function circuit block 140 is greater than a predetermined benchmark.

In some examples, each one of the speed monitors 152-155 receives the reference clock signal $CLK_{REF}$, generate a local clock signal, and determine if a frequency ratio between a frequency of the reference clock signal $CLK_{REF}$ and a frequency of the local clock signal is greater than a threshold COUNT. In some examples, the frequency of the local clock signal is programmable based on a received parameter N. In some examples, the threshold COUNT is programmable by receiving the threshold COUNT. In some other examples, the parameter N and the threshold COUNT is hardwired or one-time programmed into the performance detector 150. In some examples, the parameter N and the threshold COUNT is provided by the function circuit block 140 or by a memory or control circuit outside the function circuit block 140.

In some examples, each one of the speed monitors 152-155 is configured to measure a local operational speed of the function circuit block 140 by an approach different from the non-limiting examples described in the present disclosure.

The detection controller generates the control signal CTRL based on the detection results from the speed monitors 152-155. In some examples, the detection controller 158 is configured to generate the control signal CTRL by performing a logical combination of the speed detection results received from the speed monitors 152-155. In some examples, the logical combination includes performing an OR operation of the speed detection results received from the speed monitors 152-155. In some other examples, the logical combination corresponding to whether a number of the speed detection results indicating that the local operational speeds of the function circuit block 140 are greater than the predetermined benchmark exceeds a predetermined value. For example, in some examples, the detection controller 158 sets the control signal CTRL at a first logical value when 50% or more of the speed monitors 152-155 reporting that the measured operational speeds exceed the predetermined value; and otherwise sets the control signal CTRL at a second logical value.

Moreover, in some examples, the logical combination includes a digital low-pass filter such that the control signal CTRL reflects a long-term trend instead of a transient fluctuation of the performance variation of the functional circuit block 140.

In some examples, the performance detector 150 includes more or less than four speed monitors. In some examples, the performance detector 150 includes only one speed monitor 152. When the performance detector 150 includes only one speed monitor 152, the speed monitor 152 outputs the speed detection result thereof as the control signal CRTL, and the detection controller 158 thus may be omitted.

The regulator 120 is a low-dropout (LDO) regulator that includes a transistor 210, a control voltage driver 220, a pull-up switch 232, and a pull down switch 234. In some examples, the regulator 120 may be other types of regulator.

Transistor 210 includes a first source/drain (S/D) terminal 210s, a second S/D terminal 210d, and a control terminal (e.g., a gate terminal) 210g. The parasitic capacitance between the control terminal 210g and a ground node 202 is depicted in dotted line as a parasitic capacitive device 212. The ground node 202 is configured to carry a ground reference voltage $V_{GND}$. The first S/D terminal 210s of the transistor 210 is electrically coupled with the power rail 122 to receive the supply voltage $V_{SUPPLY}$. The second S/D terminal 210d of the transistor 210 is electrically coupled with the supply voltage line 124 to output the regulated voltage $V_{REG}$. The control terminal 210g of the transistor 210 receives a control voltage from the control voltage driver 220.

In the example depicted in FIG. 2, the transistor 210 is a P-type transistor. In some examples, the transistor 210 may be other types of transistor. In some examples, the transistor 210 includes one or more power switch transistors each occupies a first area in the IC and corresponds to a first on/off speed. In contrast, the functional circuit block 140 includes a plurality of logic transistors each occupies a second area in the IC less than the first area and corresponds to a second on/off speed greater than the first one/off speed. In one example, when the transistor 210 includes plural power switch transistors, the power switch transistors are electrically connected in parallel. In at least one example, the transistor 210 also functions as a power switch for functional circuit block 140. In some examples, the power switch functionality of the transistor 210 is controlled by the power management controller 110 (FIG. 1).

The control voltage driver 220 includes a driving stage 222, switches 224 and 226, and a capacitive device 228. The driving stage 222 includes an input node 222a that receives the control single CTRL and an output node 222b. The switch 224 is electrically coupled between the output node 222b of the driving stage 222 and a node 229. The switch 226 is electrically coupled between the node 229 and the control terminal 210g of the transistor 210. The capacitive device 228 is electrically coupled between the node 229 and the ground node 202. The switches 224 and 226 are configured to be turned on alternatively based on a clock signal $CLK_{SC}$.

The driving stage 222 in FIG. 2 is an inverter that selectively pulls the voltage level at the output node 222b toward the supply voltage $V_{SUPPLY}$ or the ground reference voltage $V_{GND}$ based on the logical value of the control signal CTRL. In some examples, the driving stage 222 includes an amplifier, a buffer, or a logical gate that has sufficient current driving capacity to adjust the voltage level at the output node 222b in response to the logical value of the control signal CTRL.

The switches 224 and 226 and the capacitive device 228 together form a switched-capacitor low-pass filter electrically coupled between the output node 222b of the driving stage 222 and the control terminal 210g of the transistor 210. The switched-capacitor low-pass filter is capable of filtering a substantially rail-to-rail voltage signal at the output node 222b to a gradually-changed voltage signal at the control terminal 210g of the transistor 210. In some examples, the parasitic capacitive device 212 at the control terminal 210g of the transistor 210 also function as another low-pass filter that smoothens the waveform at the control terminal 210g of the transistor 210. In some examples, the combination of the switches 224 and 226 and the capacitive device 228 may be replaced by other types of low-pass filter, such as a resistor-capacitor low-pass filter or a direct current (DC) decoupling capacitor.

In the example depicted in FIG. 2, the switch 224 is a P-type transistor, and the switch 226 is an N-type transistor. In some examples, the switches 224 and 226 may be other types of switches, and the clock signal $CLK_{SC}$ may be modified based on the electrical characteristics of the switches 224 and 226.

In some examples, the pull-up switch 232 selectively couples the control node 210g of the transistor 210 with the power rail 122 in response to a logical value of a control signal PUB, which corresponds to a portion of the control signals $PWR_A$ or $PWR_B$ in FIG. 1. In the example depicted in FIG. 2, the pull-up switch 232 is a P-type transistor. When the control signal PUB is logical low, the pull-up switch 232 is turned on, and the control node 210g is thus electrically coupled with the power rail 122. Accordingly, the transistor 210 is turned off to set the voltage supply line 124 to be electrically floating. When the control signal PUB is logical high, the pull-up switch 232 is turned off, and the control node 210g is not electrically coupled with the power rail 122. In some examples, the pull-up switch 232 may be implemented by other suitable types of switch.

In some examples, the pull-down switch 234 selectively couples the control node 210g of the transistor 210 with the ground node 202 in response to a logical value of a control signal PL, which also corresponds to a portion of the control signals $PWR_A$ or $PWR_B$ in FIG. 1. In the example depicted in FIG. 2, the pull-down switch 234 is an N-type transistor. When the control signal PL is logical high, the pull-down switch 234 is turned on, and the control node 210g is thus electrically coupled with the ground node 202. Accordingly, the transistor 210 is turned on to pull the regulated voltage $V_{REG}$ at the voltage supply line 124 toward the supply voltage $V_{SUPPLY}$. When the control signal PL is logical high, the pull-down switch 234 is turned off, and the control node 210g is not electrically coupled with the ground node 202. In some examples, the pull-down switch 234 may be implemented by other suitable types of switch.

In some examples, the transistor 210 also functions as a power switch for the functional circuit block 140. In some examples, when the functional circuit block 140 is deactivated, the pull-up switch 232 is turned on to turn off transistor 210. In some examples, when the functional circuit block 140 is activated, the pull-up switch 232 is turned off. Also, in some examples, during a power up stage of the functional circuit block 140, the pull-down switch 234 is turned on for a predetermined period of time to boost up the voltage level of the regulated voltage $V_{REG}$ at the voltage supply line 124. In some examples, after the power up stage of the functional circuit block 140, the pull-down switch 234 is turned off. In some examples, when the transistor 210 and the control voltage driver 220 together function as an LDO regulator, both the pull-up switch 232 and the pull-down switch 234 is turned off.

Accordingly, in some examples, the voltage level of the regulated voltage $V_{REG}$ is adjustable by controlling a conductive characteristic of the transistor 210 based on the control voltage.

In some examples, the transistor 210 includes one or more transistors connected in parallel. In an alternative embodiment, instead of controlling the conductive characteristic of the transistor 210 based on the control voltage, the conductive characteristic of the transistor 210 is controlled based on turning on only a portion of the constituent transistors of the transistor 210. In such alternative embodiment, the regulator 120 includes a control logic that determines a number of the constituent transistors of the transistor 210 to be turned on based on the control signal CTRL, and the control voltage driver 220 may be omitted. In yet alternative embodiment, a portion of the constituent transistors of the transistor 210 is controlled as discussed in the aforementioned alternative embodiment, and another portion of the constituent transistors of the transistor 210 is controlled as discussed in conjunction with FIG. 2.

Figure 3:
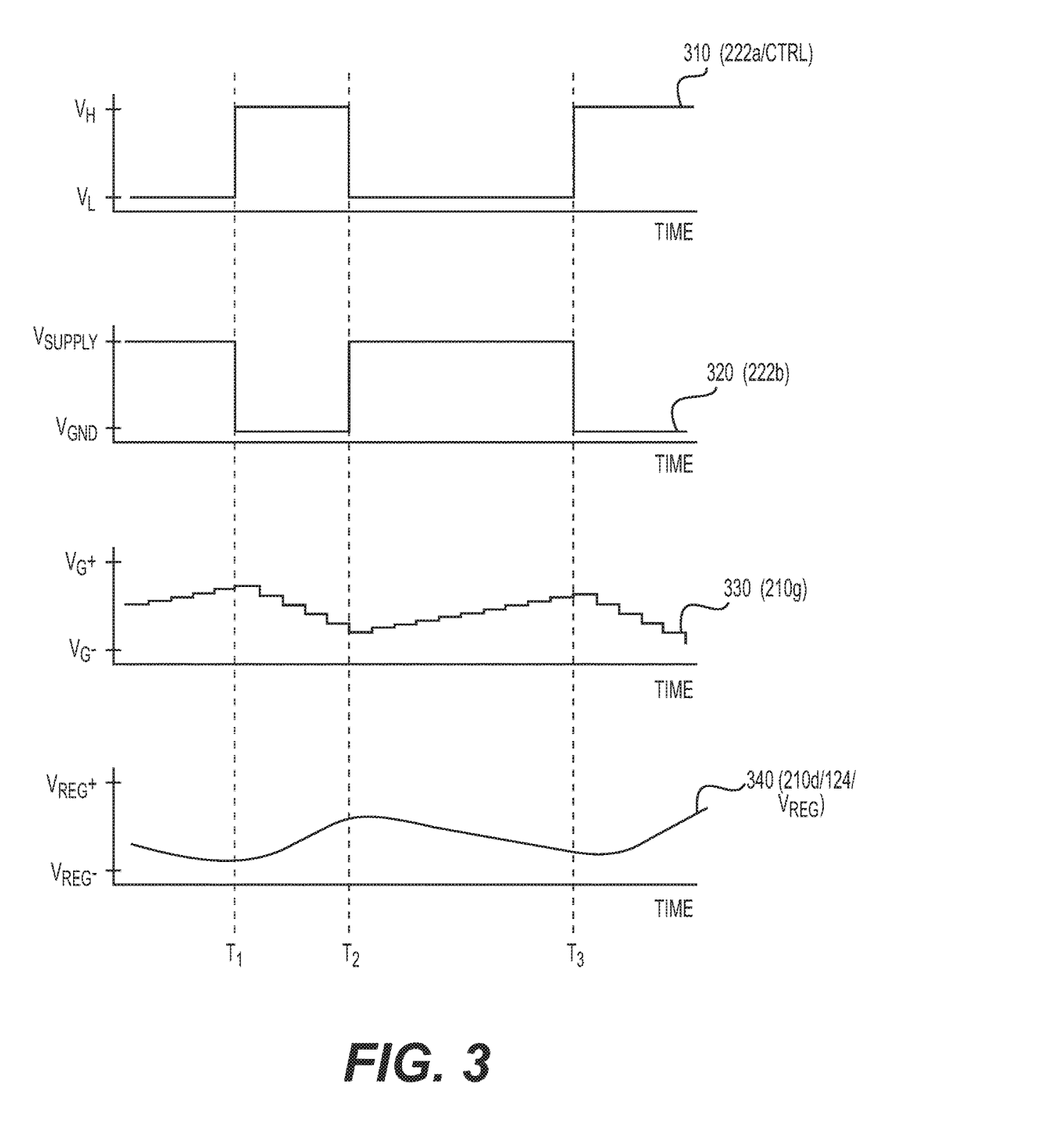
FIG. 3 shows example waveform charts of voltage levels at various nodes of a regulator according to an embodiment of the disclosure.

FIG. 3 shows example waveform charts of voltage levels at various nodes of a regulator, such as regulator 120 in FIG. 2, according to an embodiment of the disclosure. FIG. 3 shows four waveforms 310, 320, 330, and 340. Waveform 310 corresponds to a voltage level of the control signal CTRL at the input node 222a of the driving stage 222. Waveform 320 corresponds to a voltage level of a voltage at the output node 222b of the driving stage 222. Waveform 330 corresponds to a voltage level of a driving voltage at the control node 210g of the transistor 210. Waveform 340 corresponds to a voltage level of the regulated voltage $V_{REG}$ at the S/D terminal 210d or at the voltage supply line 124.

In some examples, the functional circuit block 140 and the performance detector 150 are deemed, from the perspective of the voltage supply line 124, as equivalent to a load resistor and a load capacitor connected in parallel. In some examples, the equivalent load resistor and load capacitor are function as a low-pass filter to smoothen the change of the voltage level of the regulated voltage $V_{REG}$ (i.e., waveform 340).

It is noted that the waveforms in FIG. 3 are merely simplified examples. The voltage levels and the signal frequencies may vary in different embodiments and are not depicted according to the scale.

Before time T1, the voltage level of the regulated voltage $V_{REG}$ has been set to a value sufficient for a normal operation of the regulator 120 and the performance detector 150. In some examples, setting the voltage level of the regulated voltage $V_{REG}$ to a suitable value is performed during a power up stage by turning the pull-up switch 232 off and turning the pull-down switch 234 on for a predetermined period of time.

After the start up stage but before time T1, the performance detector 150 set the voltage level of the control signal CTRL at a voltage level $V_L$ corresponding to a logical low value. The control signal CTRL having the logical low value indicates that the a measured operational speed of the functional circuit block 140 based on the speed detections results reported by the speed monitors 152-155 exceeds a predetermined benchmark. Therefore, in some examples, the voltage level of the regulated voltage $V_{REG}$ is decreased in order to reduce the power consumption of the functional circuit block 140. The driving stage 222 thus outputs a voltage at node 222n having a voltage level of the supply voltage $V_{SUPPLY}$. The switched-capacitor low-pass filter (224/226/228) gradually charges the voltage level of the driving voltage at the control node 210g toward the voltage level of the supply voltage $V_{SUPPLY}$. As a result, the transistor 210 gradually decreases the voltage level of the regulated voltage $V_{REG}$.

At time T1, the performance detector 150 determines that the measured operational speed of the functional circuit block 140 based on the speed detections results reported by the speed monitors 152-155 no longer exceeds the predetermined benchmark. The performance detector 150 thus sets the voltage level of the control signal CTRL at a voltage level $V_H$ corresponding to a logical high value. In some examples, the control signal CTRL having the logical high value indicates the voltage level of the regulated voltage $V_{REG}$ is to be increased in order to improve the performance of the functional circuit block 140. The driving stage 222 thus outputs the voltage at node 222n having a voltage level of the ground reference voltage $V_{GND}$. The switched-capacitor low-pass filter (224/226/228) gradually discharges the voltage level of the driving voltage at the control node 210g toward the voltage level of the ground reference voltage $V_{GND}$. As a result, the transistor 210 gradually increases the voltage level of the regulated voltage $V_{REG}$.

At time T2, the performance detector 150 determines that the measured operational speed of the functional circuit block 140 based on the speed detections results reported by the speed monitors 152-155 again exceeds the predetermined benchmark. In some examples, the performance detector 150 thus sets the voltage level of the control signal CTRL at $V_L$, which indicates that the voltage level of the regulated voltage $V_{REG}$ is to be decreased. The driving stage 222 thus outputs the voltage at node 222n having the voltage level of the supply voltage $V_{SUPPLY}$. The switched-capacitor low-pass filter (224/226/228) gradually charges the voltage level of the driving voltage at the control node 210g toward the voltage level of the supply voltage $V_{SUPPLY}$. As a result, the transistor 210 gradually decreases the voltage level of the regulated voltage $V_{REG}$.

At time T3, the performance detector 150 determines that the measured operational speed of the functional circuit block 140 based on the speed detections results reported by the speed monitors 152-155 again no longer exceeds the predetermined benchmark. The performance detector 150 thus sets the voltage level of the control signal CTRL at $V_H$. The driving stage 222 outputs the voltage at node 222n having the voltage level of the ground reference voltage $V_{GND}$. The switched-capacitor low-pass filter (224/226/228) gradually discharges the voltage level of the driving voltage at the control node 210g toward the voltage level of the ground reference voltage $V_{GND}$. As a result, the transistor 210 gradually increases the voltage level of the regulated voltage $V_{REG}$.

In some examples, the voltage level of the driving voltage after the power up stage varies between voltage levels $V_G^+$ and $V_G^-$. In some examples, the regulator 120 is configured such that a voltage difference between $V_G^+$ and $V_G^-$ ranges from 10 mV to 50 mV. In some examples, the voltage level of the regulated voltage $V_{REG}$ after the power up stage varies between voltage levels $V_{REG}^+$ and $V_{REG}^-$. In some examples, the regulator 120 is configured such that a voltage difference between $V_{REG}^+$ and $V_{REG}^-$ ranges from 10 mV to 200 mV.

Figure 4:
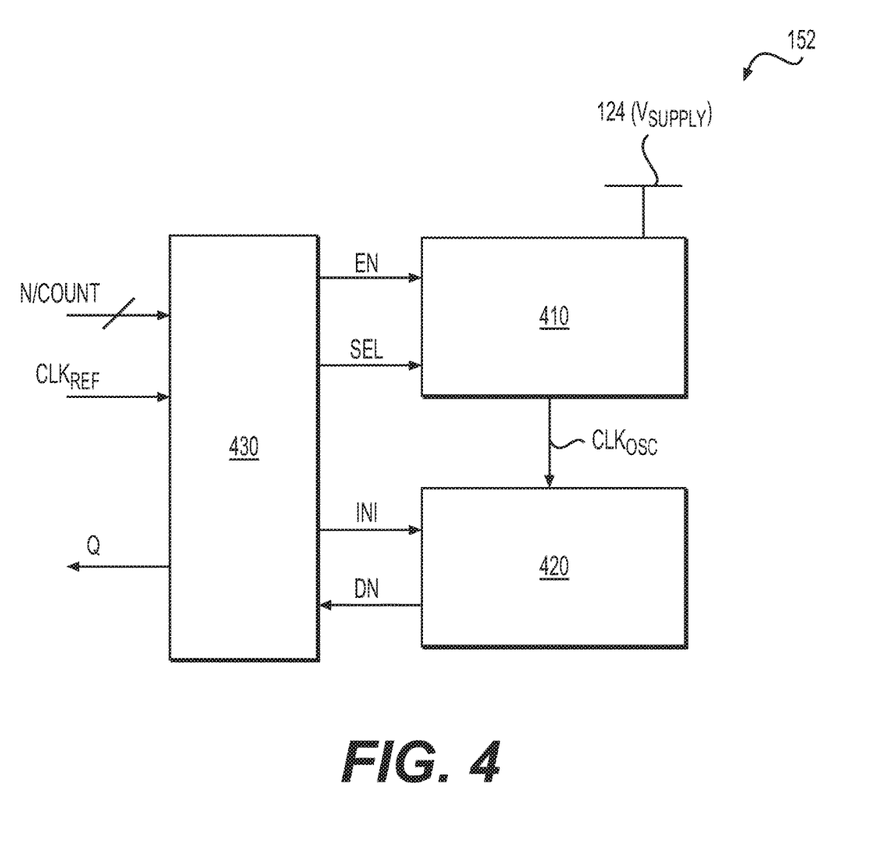
FIG. 4 shows an example functional block diagram of a speed monitor according to an embodiment of the disclosure.

FIG. 4 shows an example functional block diagram of a speed monitor 152 according to an embodiment of the disclosure. The speed monitor 152 may correspond to the speed monitors 152-155 in FIG. 2 or the speed monitors 152A-155A or 152B-155B in FIG. 1. Components in FIG. 4 that are the same or similar to those in FIG. 2 are given the same reference labels, and detailed description thereof is thus omitted.

It is noted that, in some examples, the speed monitors 152-155 in FIG. 2 and the speed monitors 152A-155A and 152B-155B in FIG. 1 may be implemented by one or more configurations different from the speed monitor 152 illustrated in FIG. 4.

The speed monitor 152 includes a ring oscillator 410, a counter 420, and a monitor controller 430. In some examples, the speed monitor 152 is implemented by a plurality of logic transistors similar to those used to form the functional circuit block 140. The ring oscillator 410 is configured to generate a local clock signal $CLK_{OSC}$. A frequency of the local clock signal $CLK_{OSC}$ is determined based on a number of inverting devices in a sequential loop of the ring oscillator 410. In some examples, the frequency of the local clock signal $CLK_{OSC}$ also depends on a voltage level of the supply voltage $V_{SUPPLY}$. In some examples, because the ring oscillator is implemented based on similar transistors and powered by the same supply voltage $V_{SUPPLY}$ as the functional circuit clock 140, the frequency of the local clock signal $CLK_{OSC}$ is used to measure a delay characteristic (and hence an operational speed accordingly) of the functional circuit clock 140.

The counter 420 is configured to generate a done signal DN indicating whether a number of clock cycles of the local clock signal $CLK_{OSC}$ reaches a threshold COUNT after the counter is initialized. In some examples, the counter 420 is an up counter, a down counter, or the like. In at least one example, the counter 420 is a down counter configured to reduce a count number one at a time in response to each clock cycle of the local clock signal $CLK_{OSC}$. In such example, the counter 420 receives the threshold COUNT as an initial count number, sets the done signal DN at a logical low value when the count number is greater than zero, and sets the done signal DN at a logical high value when the count number of the counter 420 becomes zero.

The monitor controller 430 is configured to receive the reference clock signal $CLK_{REF}$, the parameter N, and the threshold COUNT. The monitor controller 430 is also configured to receive the done signal DN from the counter 420. In some examples, the monitor controller 430 enables the ring oscillator 410 through an enable signal EN, and configures the ring oscillator 410 to set a frequency of the local clock signal $CLK_{OSC}$ through a set of selection signals SEL. In some examples, the monitor controller 430 sets the frequency of the local clock signal $CLK_{OSC}$ by configuring the number of inverting devices in a sequential loop of the ring oscillator 410. In some examples, the monitor controller 430 also initializes the counter 420. In some examples, the monitor controller 430 is configured to initialize the counter 420 by sending the threshold COUNT to the counter.

In some examples, the monitor controller 430 generates a speed detection result Q based on the done signal DN and the reference clock signal $CLK_{REF}$. For example, the monitor controller 430 initializes the counter 420 and/or enables the ring oscillator 410 in response to a rising edge of the reference clock signal $CLK_{REF}$. When the done signal DN transitions from the low logical value to the high logical value before the occurrence of a next rising edge of the reference clock signal $CLK_{REF}$, a ratio between the frequency of the local clock signal $CLK_{OSC}$ to frequency of the reference clock signal $CLK_{REF}$ is greater than the threshold COUNT. Accordingly, in some examples, the monitor controller 430 sets the speed detection result Q to a logical low value indicating that a measured operational speed is faster than a predetermined benchmark. In contrast, when the done signal DN transitions from the low logical value to the high logical value after the occurrence of the next rising edge of the reference clock signal $CLK_{REF}$, the ratio between the frequency of the local clock signal $CLK_{OSC}$ to frequency of the reference clock signal $CLK_{REF}$ is less than the threshold COUNT. Accordingly, in some examples, the monitor controller 430 sets the speed detection result Q to a logical high value indicating that a measured operational speed is slower than the predetermined benchmark.

In some examples, the speed monitor 152 is implemented based on a configuration described in U.S. Pat. No. 8,354,857, and the disclosure of which is incorporated herein by reference in its entirety.

Figure 5:
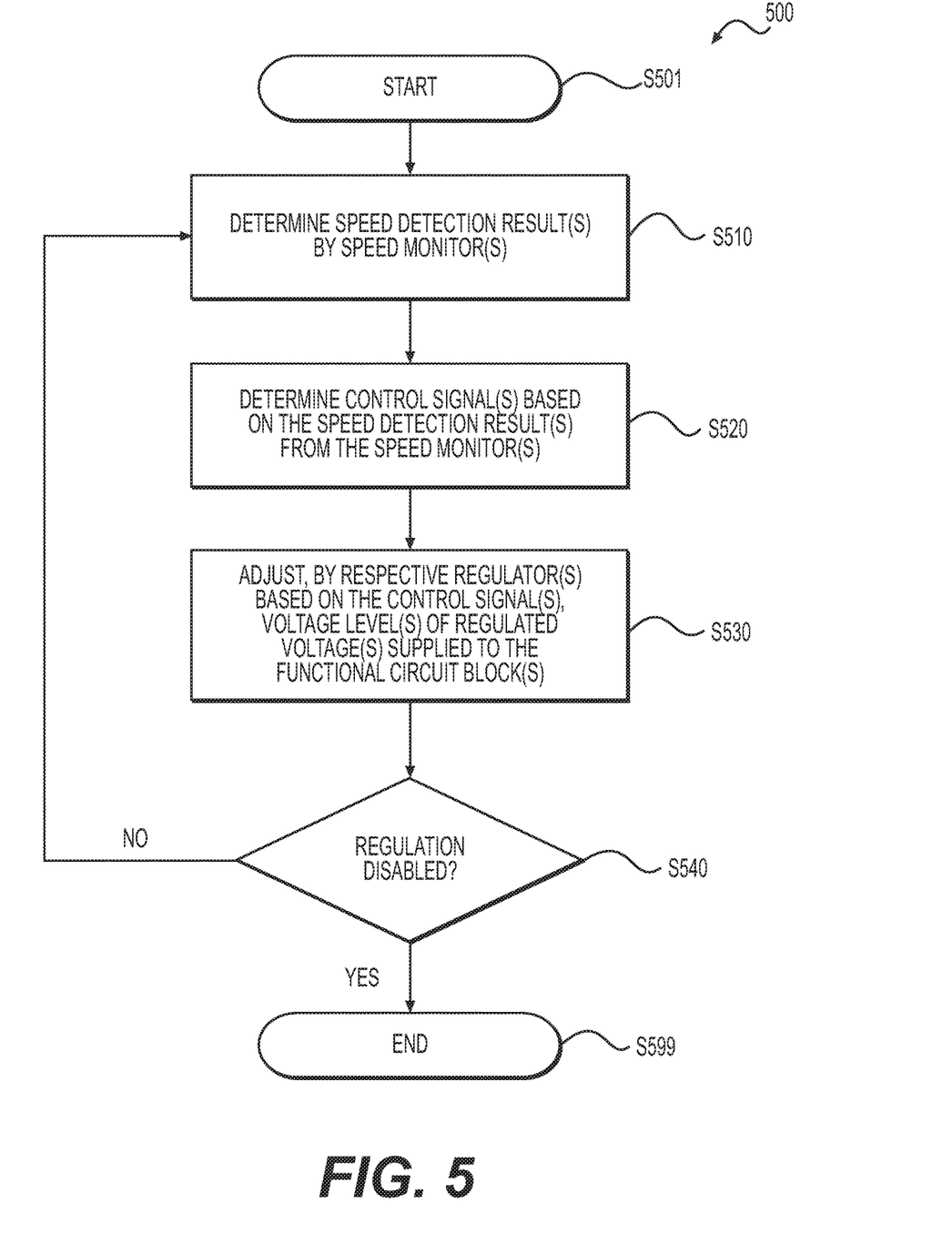
FIG. 5 shows an example flow chart outlining a process example of adjusting a regulated voltage in an IC chip according to an embodiment of the disclosure.

FIG. 5 shows an example flow chart outlining a process example 500 of adjusting a regulated voltage in an IC chip according to an embodiment of the disclosure. It is understood that additional operations may be performed before, during, and/or after the process 500 depicted in FIG. 5. The process 500 starts at S501 and proceeds to S510.

At S510, one or more speed detection results are determined (e.g., by corresponding speed monitors). The one or more speed detection results correspond to measuring one or more operational speeds of respective one or more functional circuit blocks. For example, four speed detection results are determined and/or generated by the speed monitors 152A-155A correspond to measuring an operational speed of functional circuit block 140A at various locations thereof. Four speed detection results are determined and/or generated by the speed monitors 152B-155B correspond to measuring an operational speed of functional circuit block 140B at various locations thereof. In some examples, the determination and/or generation of the speed detection results may be performed in a manner as described above with reference to FIGS. 2-4.

At S520, one or more control signals are determined and/or generated based on the corresponding sets of speed detection results. For example, the control signal $CTRL_A$ is determined and/or generated based the speed detection results from the speed monitors 152A-155A; and the control signal $CTRL_B$ is determined and/or generated based the speed detection results from the speed monitors 152B-155B. In some examples, the determination and/or generation of the control signals $CTRL_A$ and $CTRL_B$ may be performed in a manner as described above with reference to FIGS. 1 and 2.

For example, in some embodiments, the performance detector 150A associated with the functional circuit clock 140A and the regulator 120A includes a detection controller 158A that is configured to perform a logical combination of the speed detection results from the speed monitors 152A-155A and to determine and/or generate the control signal $CTRL_A$ based on the resulting value of the logical combination. In some examples, the logical combination includes performing an OR operation of the speed detection results received from the speed monitors 152A-155A. In some other examples, the logical combination corresponding to whether a number of the speed detection results indicating that the local operational speeds of the function circuit block 140A are greater than the predetermined benchmark exceeds a predetermined value. Moreover, in some examples, the logical combination includes a digital low-pass filter such that the control signal $CTRL_A$ reflects a long-term trend instead of a transient fluctuation of the performance of the functional circuit block 140A. In some examples, when the performance detector 150A includes only one speed monitor 152A, the speed monitor 152A outputs the speed detection result thereof as the control signal $CRTL_A$, and the logical combination and/or low-pass filtering processes thus may be omitted.

In some examples, the determination and/or generation of the control signal $CTRL_B$ may be performed in a manner as described above with respect to the control signal CTRLA.

At S530, the voltage level(s) of one or more regulated voltages supplied to the respective one or more functional circuit blocks are adjusted by the respective one or more regulators based on the corresponding one or more control signals. In some examples, the regulator 120A and the regulator 120B receive supply voltage $V_{SUPPLY}$ and output the regulated voltage $V_{REGA}$ and regulated voltage $V_{REGB}$ based on corresponding control signals. In some examples, the voltage level of the regulated voltage $V_{REGA}$ supplied to the functional circuit block 140A is adjusted by the regulator 120A based on the control signal $CTRL_A$. In some examples, the voltage level of the regulated voltage $V_{REGB}$ supplied to the functional circuit block 140B is adjusted by the regulator 120B based on the control signal $CTRL_B$. In some examples, the adjustment of the voltage level of the regulated voltage $V_{REGA}$ or the voltage level of the regulated voltage $V_{REGB}$ may be performed in a manner as described above with reference to FIGS. 1-4.

In some examples, the regulator 120A or 120B includes a corresponding transistor and a control voltage driver as illustrated in FIG. 2. In some examples, the control voltage driver of the regulator 120A or 120B determines and/or generates a control voltage based on the respective control signal $CTRL_A$ or $CTRL_B$. In some examples, the voltage level of the regulated voltage $V_{REGA}$ or $V_{REGB}$ is adjustable by controlling a conductive characteristic of the transistor based on the control voltage.

At S540, when the regulation functionality of a regulator is disabled, the process proceeds to S599 and terminates. At S540, when the regulation functionality is not disabled, the process proceeds to S510. In some examples, the regulation functionality of the regulator 120 is disabled when the corresponding pull-up switch 232 (FIG. 2) is turned on or when the corresponding pull-down switch 234 is turned on. In some examples, the regulation functionality of the regulator 120 is not disabled when the corresponding pull-up switch 232 and pull-down switch 234 are turned off.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit, comprising:
   a first circuit disposed in a first power domain of the integrated circuit and configured to receive a first regulated voltage, the first regulated voltage being received from a first voltage supply line disposed on the integrated circuit and powering the first power domain independently of another power domain of the integrated circuit;
   a first performance detector disposed in the first power domain and including a first speed monitor disposed adjacent to the first circuit, the first performance detector being configured to generate a first control signal based on a first speed detection result from the first speed monitor, the first speed detection result corresponding to measuring an operational speed of the first circuit; and
   a first regulator configured to
   receive a global supply voltage from a power rail, and
   output the first regulated voltage to the first circuit based on the global supply voltage and the first control signal regardless of a detected performance of other circuits on the integrated circuit that are disposed outside the first power domain.

2. The integrated circuit of claim 1, further comprising:
   a second circuit disposed in a second power domain of the integrated circuit and configured to receive a second regulated voltage that powers the second power domain from a second voltage supply line disposed on the integrated circuit, the second power domain being different from the first power domain;
   a second performance detector disposed in the second power domain and including a second speed monitor disposed adjacent to the second circuit, the second performance detector being configured to generate a second control signal based on a second speed detection result from the second speed monitor, the second speed detection result corresponding to measuring an operational speed of the second circuit; and
   a second regulator configured to
   receive the global supply voltage from the power rail, and
   output the second regulated voltage to the second circuit based on the global supply voltage and the second control signal regardless of a detected performance of other circuits on the integrated circuit that are disposed outside the second power domain.

3. The integrated circuit of claim 1, wherein
   the first performance detector includes a plurality of speed monitors respectively disposed at different locations, the speed monitors being configured to generate speed detection results indicating whether measured operation speeds are greater than a benchmark, respectively; and
   the first performance detector further comprises a detection controller configured to generate the first control signal based on the speed detection results from the plurality of speed monitors.

4. The integrated circuit of claim 3, wherein the detection controller is configured to generate the first control signal by performing a logical combination of the speed detection results received from the plurality of speed monitors.

5. The integrated circuit of claim 1, wherein the first regulator comprises:
   a transistor having a first terminal configured to receive the global supply voltage, a second terminal electrically coupled with the first voltage supply line and configured to output the first regulated voltage, and a control terminal configured to receive a control voltage; and
   a control voltage driver configured to output the control voltage based on the first control signal.

6. The integrated circuit of claim 5, wherein the control voltage driver comprises:
   a driving stage having an input node and an output node, the input node of the driving stage being configured to receive the first control signal; and
   a low-pass filter electrically coupled between the output node of the driving stage and the control terminal of the transistor.

7. The integrated circuit of claim 6, wherein the low-pass filter comprises:

a first switch between the output node of the driving stage and an intermediate node;
a second switch between the intermediate node and the control terminal of the transistor, the first switch and the second switch being configured to be turned on alternatively; and
a capacitive device electrically coupled with the intermediate node.

8. The integrated circuit of claim 5, further comprising:
a pull-up switch configured to selectively couple the control terminal of the transistor to the global supply voltage; and
a pull-down switch configured to selectively couple the control terminal of the transistor to a ground reference voltage.

9. The integrated circuit of claim 5, wherein
the transistor includes one or more power switch transistors respectively occupying a first area in the integrated circuit and corresponding to a first on/off speed, and
the first circuit includes a plurality of logic transistors respectively occupying a second area in the integrated circuit that is less than any of the first area(s) and that corresponds to a second on/off speed greater than any of the first on/off speed(s).

10. The integrated circuit of claim 1, wherein the first speed monitor of the first performance detector comprises:
a ring oscillator configured to generate a local clock signal;
a counter configured to generate a done signal indicating whether a number of clock cycles of the local clock signal reaches a threshold after the counter is initialized; and
a monitor controller configured to
receive a reference clock signal and the done signal, initialize the counter, and
generate a speed detection result based on the done signal and the reference clock signal.

11. The integrated circuit of claim 10, wherein the monitor controller is further configured to
set a frequency of the local clock signal by configuring a number of inverting devices in a sequential loop of the ring oscillator.

12. A method of adjusting one or more regulated voltages supplied to one or more respective circuits in an integrated circuit, the method comprising:
determining a first speed detection result by a first speed monitor disposed adjacent to a first circuit, the first speed monitor and the first circuit being disposed in a first power domain of in the integrated circuit, the first speed detection result corresponding to measuring an operational speed of the first circuit;
determining a first control signal based on the first speed detection result from the first speed monitor;
receiving, by a first regulator, a global supply voltage from a power rail; and
outputting, by the first regulator based on the global supply voltage and the first control signal regardless of a detected performance of other circuits outside the first power domain, a first regulated voltage that powers the first power domain independently of another power domain of the integrated circuit.

13. The method of claim 12, further comprising:
determining a second speed detection result by a second speed monitor disposed adjacent to a second circuit, the second speed monitor and the second circuit being disposed in a second power domain of the integrated circuit, the second power domain being different from the first power domain, the second speed detection result corresponding to measuring an operational speed of the second circuit;
determining a second control signal based on the second speed detection result from the second speed monitor;
receiving, by a second regulator, the global supply voltage from the power rail; and
outputting, by the second regulator based on the global supply voltage and the second control signal regardless of a detected performance of other circuits outside the second power domain, a second regulated voltage that powers the second power domain.

14. The method of claim 12, further comprising:
determining speed detection results by a plurality of speed monitors indicating whether measured operation speeds are greater than a benchmark, respectively,
wherein determining the first control signal is performed based on the speed detection results from the plurality of speed monitors.

15. The method of claim 14, wherein determining the first control signal comprises performing a logical combination of the speed detection results received from the plurality of speed monitors.

16. The method of claim 15, wherein generating the logical combination comprises:
performing an OR operation of the speed detection results received from the plurality of speed monitors.

17. The method of claim 12, wherein adjusting the voltage level of the first regulated voltage comprises:
determining a control voltage based on the first control signal; and
controlling a conductive characteristic of a transistor based on the control voltage, the transistor having a first terminal configured to receive the global supply voltage, a second terminal configured to output the first regulated voltage, and a control terminal configured to receive the control voltage.

18. An integrated circuit, comprising:
a plurality of circuits disposed in respective power domains of the integrated circuit and each circuit configured to receive a corresponding regulated voltage that independently powers a different power domain;
a plurality of performance detectors disposed in the respective power domains and including respective sets of speed monitors disposed adjacent to the respective circuits, the performance detectors being configured to generate respective control signals based on speed detection results from the sets of speed monitors, the speed detection results corresponding to measuring operational speeds of the respective circuits; and
a plurality of regulators disposed on the integrated circuit, ones of the plurality of regulators being configured to receive a supply voltage from a power rail and output the respective regulated voltage to the respective circuit based on the supply voltage and the respective control signal regardless of a detected performance of other circuits outside the respective power domain.

19. The integrated circuit of claim 18, wherein each of the plurality of regulators comprises:
a transistor having a first terminal configured to receive the supply voltage, a second terminal configured to output the respective regulated voltage, and a control terminal configured to receive a control voltage; and
a control voltage driver configured to output the control voltage based on the respective control signal.

20. The integrated circuit of claim 19, wherein
the transistors of the plurality of regulators include power switch transistors respectively occupying a first area in the integrated circuit and corresponding to a first on/off speed, and
the plurality of circuits includes logic transistors respectively occupying a second area that is less than any of the first areas and corresponding to a second on/off speed greater than any of the first on/off speed(s).

* * * * *